United States Patent
Chung

(10) Patent No.: US 9,824,768 B2
(45) Date of Patent: Nov. 21, 2017

(54) INTEGRATED OTP MEMORY FOR PROVIDING MTP MEMORY

(71) Applicant: Shine C. Chung, San Jose, CA (US)

(72) Inventor: Shine C. Chung, San Jose, CA (US)

(73) Assignee: ATTOPSEMI TECHNOLOGY CO., LTD (TW)

(*) Notice: Subject to any disclaimer, the term of this patent is extended or adjusted under 35 U.S.C. 154(b) by 0 days.

(21) Appl. No.: 15/076,460

(22) Filed: Mar. 21, 2016

(65) Prior Publication Data
US 2016/0276043 A1    Sep. 22, 2016

Related U.S. Application Data

(60) Provisional application No. 62/136,608, filed on Mar. 22, 2015.

(51) Int. Cl.
*G11C 17/16* (2006.01)
*G11C 17/18* (2006.01)

(52) U.S. Cl.
CPC ........... *G11C 17/165* (2013.01); *G11C 17/18* (2013.01)

(58) Field of Classification Search
USPC .......................................................... 365/96
See application file for complete search history.

(56) References Cited

U.S. PATENT DOCUMENTS

| | | |
|---|---|---|
| 3,198,670 A | 8/1965 | Nissim |
| 3,715,242 A | 2/1973 | Daniel |
| 4,148,046 A | 4/1979 | Hendrickson et al. |
| 4,192,059 A | 3/1980 | Khan et al. |
| 4,642,674 A | 2/1987 | Schoofs |
| 5,192,989 A | 3/1993 | Matsushita et al. |
| 5,389,552 A | 2/1995 | Iranmanesh |
| 5,447,876 A | 9/1995 | Moyer et al. |

(Continued)

FOREIGN PATENT DOCUMENTS

| | | |
|---|---|---|
| CN | 03-264814 | 11/1991 |
| CN | 1469473 A | 1/2004 |

(Continued)

OTHER PUBLICATIONS

U.S. Appl. No. 13/471,704, filed May 15, 2012.

(Continued)

*Primary Examiner* — Hoai V Ho
*Assistant Examiner* — Minh Dinh

(57) ABSTRACT

An integrated One-Time Programmable (OTP) memory to emulate an Multiple-Time Programmable (MTP) memory with a built-in program count tracking and block address mapping is disclosed. The integrated OTP memory has at least one non-volatile block register and count register to respectively store block sizes and program counts for different block/count configurations. The count register can be programmed before each round of programming occurs to indicate a new block for access. The integrated OTP memory also can generate a block address based on values from the count and block registers. By combining the block address with the lower bits of an input address, a final address can be generated and used to access different blocks (associated with different program counts) in the OTP memory to mimic an MTP memory.

23 Claims, 7 Drawing Sheets

Logic Memory Map    Physical Memory Map

(56) References Cited

U.S. PATENT DOCUMENTS

| | | |
|---|---|---|
| 5,635,742 A | 6/1997 | Hoshi et al. |
| 5,637,901 A | 6/1997 | Beigel et al. |
| 5,723,890 A | 3/1998 | Fujihira et al. |
| 5,757,046 A | 5/1998 | Fujihira et al. |
| 5,761,148 A | 6/1998 | Allan et al. |
| 5,962,903 A | 10/1999 | Sung et al. |
| 6,002,156 A | 12/1999 | Lin |
| 6,008,092 A | 12/1999 | Gould |
| 6,034,882 A | 3/2000 | Johnson et al. |
| 6,054,344 A | 4/2000 | Liang et al. |
| 6,140,687 A | 10/2000 | Shimormura et al. |
| 6,243,864 B1 | 6/2001 | Odani et al. |
| 6,249,472 B1 | 6/2001 | Tamura et al. |
| 6,346,727 B1 | 2/2002 | Ohtomo |
| 6,388,292 B1 | 5/2002 | Lin |
| 6,400,540 B1 | 6/2002 | Chang |
| 6,405,160 B1 | 6/2002 | Djaja et al. |
| 6,461,934 B2 | 10/2002 | Nishida et al. |
| 6,483,734 B1 | 11/2002 | Sharma et al. |
| 6,597,629 B1 | 7/2003 | Raszka et al. |
| 6,611,043 B2 | 8/2003 | Takiguchi |
| 6,731,535 B1 | 5/2004 | Ooishi et al. |
| 6,770,953 B2 | 8/2004 | Boeck et al. |
| 6,798,684 B2 | 9/2004 | Low et al. |
| 6,803,804 B2 | 10/2004 | Madurawe |
| 6,813,705 B2 | 11/2004 | Duesterwald et al. |
| 6,897,543 B1 | 5/2005 | Huang et al. |
| 6,934,176 B2 | 8/2005 | Low et al. |
| 6,944,083 B2 | 9/2005 | Pedlow |
| 6,967,879 B2 | 11/2005 | Mizukoshi |
| 7,009,182 B2 | 3/2006 | Kannan et al. |
| 7,102,951 B2 | 9/2006 | Paillet et al. |
| 7,167,397 B2 | 1/2007 | Paillet et al. |
| 7,211,843 B2 | 5/2007 | Low et al. |
| 7,212,432 B2 | 5/2007 | Ferrant Et |
| 7,224,598 B2 | 5/2007 | Perner |
| 7,263,027 B2 | 8/2007 | Kim et al. |
| 7,294,542 B2 | 11/2007 | Okushima |
| 7,369,452 B2 | 5/2008 | Kenkare et al. |
| 7,391,064 B1 | 6/2008 | Tripsas et al. |
| 7,411,844 B2 | 8/2008 | Nitzan et al. |
| 7,439,608 B2 | 10/2008 | Arendt |
| 7,461,371 B2 | 12/2008 | Luo et al. |
| 7,573,762 B2 | 8/2009 | Kenkare et al. |
| 7,579,232 B1 | 8/2009 | Ping |
| 7,589,367 B2 | 9/2009 | Oh et al. |
| 7,609,578 B2 | 10/2009 | Buer et al. |
| 7,660,181 B2 | 2/2010 | Kumar et al. |
| 7,696,017 B1 | 4/2010 | Tripsas et al. |
| 7,701,038 B2 | 4/2010 | Chen et al. |
| 7,759,766 B2 | 7/2010 | Booth |
| 7,764,532 B2 | 7/2010 | Kurjanowicz et al. |
| 7,772,591 B1 | 8/2010 | Shih et al. |
| 7,802,057 B2 | 9/2010 | Iyer et al. |
| 7,808,815 B2 | 10/2010 | Ro et al. |
| 7,830,697 B2 | 11/2010 | Herner |
| 7,833,823 B2 | 11/2010 | Klersy |
| 7,852,656 B2 | 12/2010 | Shin et al. |
| 7,859,920 B2 | 12/2010 | Jung |
| 7,889,204 B2 | 2/2011 | Hansen et al. |
| 7,910,999 B2 | 3/2011 | Lee et al. |
| 8,008,723 B2 | 8/2011 | Nagai |
| 8,050,129 B2 | 11/2011 | Liu et al. |
| 8,089,137 B2 | 1/2012 | Lung et al. |
| 8,115,280 B2 | 2/2012 | Chen et al. |
| 8,119,048 B2 | 2/2012 | Nishimura |
| 8,168,538 B2 | 5/2012 | Chen et al. |
| 8,174,063 B2 | 5/2012 | Liu et al. |
| 8,174,922 B2 | 5/2012 | Naritake |
| 8,179,711 B2 | 5/2012 | Kim et al. |
| 8,183,665 B2 | 5/2012 | Bertin et al. |
| 8,217,490 B2 | 7/2012 | Bertin et al. |
| 8,233,316 B2 | 7/2012 | Liu et al. |
| 8,339,079 B2 | 12/2012 | Tamada |
| 8,369,166 B2 | 2/2013 | Kurjanowicz et al. |
| 8,373,254 B2 | 2/2013 | Chen et al. |
| 8,380,768 B2 | 2/2013 | Hoefler |
| 8,415,764 B2 | 4/2013 | Chung |
| 8,482,972 B2 | 7/2013 | Chung |
| 8,488,359 B2 | 7/2013 | Chung |
| 8,488,364 B2 | 7/2013 | Chung |
| 8,503,141 B2 | 8/2013 | Mallikarjunaswamy |
| 8,514,606 B2 | 8/2013 | Chung |
| 8,526,254 B2 | 9/2013 | Kurjanowicz et al. |
| 8,559,208 B2 | 10/2013 | Chung |
| 8,570,800 B2 | 10/2013 | Chung |
| 8,576,602 B2 | 11/2013 | Chung |
| 8,598,639 B2 | 12/2013 | Hsin |
| 8,643,085 B2 | 2/2014 | Pfirsch |
| 8,644,049 B2 | 2/2014 | Chung |
| 8,648,349 B2 | 2/2014 | Masuda et al. |
| 8,649,203 B2 | 2/2014 | Chung |
| 8,680,620 B2 | 3/2014 | Salcedo |
| 8,699,259 B2 | 4/2014 | Zhang et al. |
| 8,760,904 B2 | 6/2014 | Chung |
| 8,804,398 B2 | 8/2014 | Chung |
| 8,817,563 B2 | 8/2014 | Chung |
| 8,830,720 B2 | 9/2014 | Chung |
| 8,848,423 B2 | 9/2014 | Chung |
| 8,854,859 B2 | 10/2014 | Chung |
| 8,861,249 B2 | 10/2014 | Chung |
| 8,913,415 B2 | 12/2014 | Chung |
| 8,913,449 B2 | 12/2014 | Chung |
| 8,923,070 B2 | 12/2014 | Xia |
| 8,923,085 B2 | 12/2014 | Chung |
| 8,929,122 B2 | 1/2015 | Chung |
| 8,988,965 B2 | 3/2015 | Chung |
| 9,019,742 B2 | 4/2015 | Chung |
| 9,019,791 B2 | 4/2015 | Chung |
| 9,025,357 B2 | 5/2015 | Chung |
| 9,070,437 B2 | 6/2015 | Chung |
| 9,178,100 B2 | 11/2015 | Webster |
| 9,236,141 B2 | 1/2016 | Chung |
| 9,281,038 B2 | 3/2016 | Chung |
| 9,305,973 B2 | 4/2016 | Chung |
| 9,324,447 B2 | 4/2016 | Chung |
| 9,324,849 B2 | 4/2016 | Chung |
| 9,343,176 B2 | 5/2016 | Chung |
| 9,460,807 B2 | 10/2016 | Chung |
| 9,478,306 B2 | 10/2016 | Chung |
| 2002/0018355 A1 | 2/2002 | Johnson et al. |
| 2002/0075744 A1 | 6/2002 | McCollum |
| 2002/0168821 A1 | 11/2002 | Williams et al. |
| 2002/0196659 A1 | 12/2002 | Hurst et al. |
| 2003/0104860 A1 | 6/2003 | Cannon et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2004/0130924 A1 | 7/2004 | Ma et al. |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2005/0242386 A1 | 11/2005 | Ang |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2007/0004160 A1 | 1/2007 | Voldman |
| 2007/0008776 A1 | 1/2007 | Scheuerlein et al. |
| 2007/0030026 A1 | 2/2007 | Hsu et al. |
| 2007/0057323 A1 | 3/2007 | Furukawa et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0223266 A1 | 9/2007 | Chen |
| 2007/0279978 A1 | 12/2007 | Ho et al. |
| 2008/0025068 A1 | 1/2008 | Scheuerlein et al. |
| 2008/0028134 A1 | 1/2008 | Matsubara et al. |

(56) References Cited

U.S. PATENT DOCUMENTS

| | | |
|---|---|---|
| 2008/0044959 A1 | 2/2008 | Cheng et al. |
| 2008/0067601 A1 | 3/2008 | Chen |
| 2008/0105878 A1 | 5/2008 | Ohara |
| 2008/0151612 A1 | 6/2008 | Pellizzer et al. |
| 2008/0170429 A1 | 7/2008 | Bertin et al. |
| 2008/0175060 A1 | 7/2008 | Liu et al. |
| 2008/0220560 A1 | 9/2008 | Klersy |
| 2008/0225567 A1 | 9/2008 | Burr et al. |
| 2008/0280401 A1 | 11/2008 | Burr et al. |
| 2008/0316852 A1 | 12/2008 | Matsufuji et al. |
| 2009/0055617 A1 | 2/2009 | Bansal et al. |
| 2009/0115021 A1 | 5/2009 | Moriwaki |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0309089 A1 | 12/2009 | Hsia et al. |
| 2010/0027326 A1 | 2/2010 | Kim et al. |
| 2010/0061136 A1 | 3/2010 | Koyama et al. |
| 2010/0085798 A1 | 4/2010 | Lu et al. |
| 2010/0091546 A1 | 4/2010 | Liu et al. |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0177547 A1* | 7/2010 | Shen .............. G11C 17/18 365/94 |
| 2010/0201410 A1 | 8/2010 | Illegems |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0250974 A1* | 9/2010 | Ristic .............. G06F 1/3203 713/300 |
| 2010/0277967 A1 | 11/2010 | Lee et al. |
| 2010/0301304 A1 | 12/2010 | Chen et al. |
| 2011/0022648 A1 | 1/2011 | Harris et al. |
| 2011/0062557 A1 | 3/2011 | Bandyopadhyay et al. |
| 2011/0108926 A1 | 5/2011 | Bahl |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0222330 A1 | 9/2011 | Lee et al. |
| 2011/0260289 A1 | 10/2011 | Oyamada |
| 2011/0267869 A1 | 11/2011 | Hoefler |
| 2011/0297912 A1 | 12/2011 | Samachisa et al. |
| 2011/0310655 A1 | 12/2011 | Kreupl et al. |
| 2011/0312166 A1 | 12/2011 | Yedinak et al. |
| 2012/0032303 A1 | 2/2012 | Elkareh et al. |
| 2012/0039107 A1 | 2/2012 | Chung |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0256292 A1 | 10/2012 | Yu et al. |
| 2012/0257435 A1 | 10/2012 | Lin |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0208526 A1 | 8/2013 | Chung |
| 2013/0215663 A1 | 8/2013 | Chung |
| 2013/0235644 A1 | 9/2013 | Chung |
| 2013/0268526 A1 | 10/2013 | John et al. |
| 2013/0308366 A1 | 11/2013 | Chung |
| 2014/0010032 A1 | 1/2014 | Seshadri et al. |
| 2014/0016394 A1 | 1/2014 | Chung et al. |
| 2014/0071726 A1 | 3/2014 | Chung |
| 2014/0092674 A1 | 4/2014 | Chung |
| 2014/0124871 A1 | 5/2014 | Ko et al. |
| 2014/0124895 A1 | 5/2014 | Salzman et al. |
| 2014/0126266 A1 | 5/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0160830 A1 | 6/2014 | Chung |
| 2014/0211567 A1 | 7/2014 | Chung |
| 2014/0269135 A1 | 9/2014 | Chung |
| 2014/0340954 A1 | 11/2014 | Chung |
| 2015/0003142 A1 | 1/2015 | Chung |
| 2015/0003143 A1 | 1/2015 | Chung |
| 2015/0009743 A1 | 1/2015 | Chung |
| 2015/0014785 A1 | 1/2015 | Chung |
| 2015/0021543 A1 | 1/2015 | Chung |
| 2015/0029777 A1 | 1/2015 | Chung |
| 2015/0078060 A1 | 3/2015 | Chung |
| 2015/0137258 A1 | 5/2015 | Mittal |
| 2015/0194433 A1 | 7/2015 | Ponoth |
| 2016/0034351 A1* | 2/2016 | Michael ............ G06F 11/1072 714/758 |
| 2016/0071582 A1 | 3/2016 | Chung |
| 2016/0268002 A1 | 9/2016 | Chen |
| 2016/0276043 A1 | 9/2016 | Chung |
| 2017/0110512 A1 | 4/2017 | Chung |

FOREIGN PATENT DOCUMENTS

| | | |
|---|---|---|
| CN | 1691204 A | 11/2005 |
| CN | 101057330 A | 10/2007 |
| CN | 101083227 A | 12/2007 |
| CN | 101188140 A | 5/2008 |
| CN | 101271881 A | 9/2008 |
| CN | 101483062 A | 7/2009 |
| CN | 101728412 A | 6/2010 |
| EP | 1367596 A1 | 12/2003 |
| TW | I309081 | 10/2007 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Patent Application No. 13/026,835 filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.

(56) References Cited

OTHER PUBLICATIONS

U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/590,044, filed Aug. 20. 2012.
U.S. Appl. No. 13/590,047, filed Aug. 20. 2012.
U.S. Appl. No. 13/590,049, filed Aug. 20. 2012.
U.S. Appl. No. 13/590,050, filed Aug. 20. 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE Vlsi Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle Mram With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., Lateral Polysilicon n+p. Diodes: Effect of the Grain boundaries and of the p-Implemented Doping Level on the I-V and C-V Characteristics, "Springer Proceedings in Physics", vol. 54, 1991, pp. 318-322.
Aziz, A. et al., "Lateral Polysilicon PN Diodes: Current-Voltage Characteristics Simulation Between 200K and 400K a Numerical Approach," IEEE Trans. On Elec. Dev., vol. 41, No. 2, Feb, 1994, pp. 204-211.
Banerjee, Kaustav et al., "High Current Effects in Silicide Films for Sub-0.25um VLSI Technologies," IEEE 36th IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. On Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp, Jun. 2004, pp. 442-445.
Bedeschi, F. et al., "Set and Reset Pulse Characterization in BJT-Selected Phase-Change Memory," IEEE Int. Symp. On Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.
Cagli, C. et al., "Evidence for threshold switching in the set process of NiO-based Rram and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.
Chan, Wan Tim, et al., "CMOS Compatible Zero-Mask One Time Programmable Memory Design", Master Thesis, Hong-Kong University of Science and Technologies, 2008.

Chang, Meng-Fan et al., "Circuit Design Challenges in Embedded Memory and Resistive Ram (RRAM) for Mobile SoC and 3D-IC", Design Automation Conference (ASP-DAC), 16th Asia and South Pacific, 2011, pp. 197-203.
Cheng, Yu-Hsing et al., "Failure Analysis and Optimization of Metal Fuses for Post Package Trimming," IEEE 45th IRPS, 2007, pp. 616-617.
Chiu, Pi-Feng et al., "A Low Store Energy, Low VDDmin, Non-volatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512x8 Electrical Fuse Memory with 15um2 Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report Tr-02-47, Dept. of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr., 2007, pp. 839-845.
Dion, Michael J., "Reservoir Modeling for Electromigration Improvement of Metal Systems with Refractory Barriers," IEEE 39th IRPS, 2001, pp. 327-333.
Doorn, T. S. et al., "Ultra-fast Programming of Silicided Polysilicon Fuses Based on New Insights in the Programming Physics," IEEE IEDM, 2005, pp. 667-670.
Doorn, T. S., "Detailed Qualitative Model for the Programming Physics of Silicided Polysilicon Fuses," IEEE Trans. On Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle Mram Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43rd IRPS, 2005, pp. 446-449.
Gao, B. et al., "Oxide-Based RRAM: Uniformity Improvement Using a New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory-A High Performance Nonvolatile Memory Technology for Stand-Alone Memory and Embedded Applications," IEEE, ISSCC Dig. of Tech. Paper, Feb. 2002, pp. 202-203.

(56) References Cited

OTHER PUBLICATIONS

Gogl, D. et aL, "A 16-Mb MRAM Featuring Bootstrapped Write Drivers," IEEE J. of Solid-State Circuits, vol. 40, No. 4, Apr. 2005, pp. 902-908.

Gopalan, C. et al., Demonstration of Conductive Bridging Random Access Memory (CBRAM) in Logic CMOS Process, IEEE Int. Memory Workshop, 2010, pp. 1-4.

Ha, Daewon and Kim, Kinam, "Recent Advances in High Density Phase Change Memory (PRAM)," IEEE VLSI Tech. Symp. Jun. 2007.

Hosoi, Y. et al., "High Speed Unipolar Switching Resistance RAM (RRAM) Technology," IEEE IEDM, Dec. 2006, pp. 1-4.

Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.

Huang, Chia-En et al., "A New CMOS Logic Anti-Fuse Cell with Programmable Contact," IEEE IEDM Tech. Dig. 2007, pp. 48-51.

Im, Jay et al., "Characterization of Silicided Polysilicon Fuse Implemented in 65nm CMOS Technology,"7th Annual Non-Volatile Memory Technology Symp, (NVMTS) 2006, pp. 55-57.

Jin, Li-Yan et aL, "Low-Area 1-Kb Multi-Bit OTP IP Design," IEEE 8th Int. Conf. on ASIC (ASICON), 2009. pp. 629-632.

Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.

Kalnitsy, Alexander et al., "CoSi2 Integrated Fuses on Poly Silicon for Low Voltage 0.18um CMOS Applications," IEEE IEDM 1999, pp. 765-768.

Kang, Han-Byul et al., "Electromigration of NiSi Poly Gated Electrical Fuse and Its Resistance Behaviors Induced by By High Temperature," IEEE IRPS, 2010, pp. 265-270.

Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.

Kawahara, T. et al., "2Mb Spin-Transfer Torque RAM (SPRAM) with Bit-by-Bit Bidirectional Current Write and Parailelizing-Direction Current Read," IEEE ISSCC Dig. of Tech. Paper, Feb. 2007, pp. 480-481.

Ker, Ming-Dou et al., "High-Current Polysilicon Diode for Electrostatic Discharge Protection in Sub-Quarter-Micron Complementary Metal Oxide Semiconductor Technology," Characterization of Jpn. J. Appl. Phys. vol. 42 (2003) pp. 3377-3378.

Ker, Ming-Dou et al., "Ultra-High-Voltage Charge Pump Circuit in Low-Voltage Bulk CMOS Processes With Polysilicon Diodes," IEEE Trans. on Cir. And Sys.-II: Exp. Brief., vol. 54, No. 1, Jan. 2007, pp. 47-51.

Kim, Deok-Kee et al., "An Investigation of Electrical Current Induced Phase Transitions in the NiPtSi/Polysilicon System," J. App. Phy. 103, 073708 (2008).

Kim, I. S. et al., "High Performance Pram Cell Scalable to sub-20nm Technology with below 4F2 Cell Size, Extendable to DRAM Applications," IEEE VLSI Tech Symp., Jun. 2010, pp. 203-204.

Kim, Jinbong et al., "3-Transistor Antifuse OTP ROM Array Using Standard CMOS Process," IEEE VLSI Cir. Symposium, Jun. 2003, pp. 239-242.

Kim, O. et al., "CMOS trimming circuit based on polysilicon fusing," Elec. Lett. vol. 34, No. 4, pp. 355-356, Feb. 1998.

Klee, V. et al., "A 0.13um Logic Based Embedded DRAM Technology with Electrical Fuses, Cu Interconnect in SiLK, sub-7ns Random Access Time and its Extension to the 0.10um Generation," IEEE IEDM, 2001, pp. 407-410.

Kothandaramam, C. et al., "Electrically programmable fuse (eFUSE) using electromigration in silicides," IEEE Elec. Dev. Lett., vol. 23, No. 9, pp. 523-525, Sep. 2002.

Kulkarni, S. et al., "High-Density 3-D Metal-Fuse Prom Featuring 1.37um2 1T1R Bit Cell in 32nm High-K Metal-Gate CMOS Technology," VLSI Cir. Symp., Jun. 2009 pp. 28-29.

Kulkarni, S. et al., "A 4Kb Metal-Fuse OTP-ROM Macro Featuring a 2V Programmable 1.37um2 1T1R Bit Cell in 32nm High-K Metal-Gate Cmos," IEEE J. of Sol. Stat. Cir, vol., 45, No. 4, Apr. 2010, pp. 863-868.

Kund, Michael et al., "Conductive Bridging RAM (CBRAM): An Emerging NonVolatile Memory Technology Scalable to Sub 20nm," IEEE IEDM 2005, pp. 754-757.

Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.

Lai, S., "Current Status of the Phase Change Memory and Its Future," IEEE IEDM Dig. of Tech. Paper, Dec. 2003, pp. 255-258.

Lee, H. Y. et al., "Low Power and High Speed Bipolar Switching with a Thin Reactive Ti Buffer Layer in Robust HfO2 Based RRAM," IEEE IEDM, 2008, pp. 14.

Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.

Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.

Lee, M.-J. et al., "Stack Friendly all-Oxide 3D Rram Using GaInZnO Peripheral TFT Realized Over Glass Substrates," IEDM, Dec. 2008. pp. 1-4.

Lee, Man Chiu et al., "OTP Memory for Low Cost Passive Rfid Tags," IEEE Conf. on Electron Devices and Solid-State Circuits (EDSSC), 2007, pp. 633-636.

Liaw, Corvin et al., "The Conductive Bridging Random Access Memory (CBRAM): A Non-volatile Multi-Level Memory Technology,"European Solid-State Device Research Conference (ESSDERC), 2007, pp. 226-229.

Lim, Kyunam et al., "Bit Line Coupling Scheme and Electrical Fuse Circuit for Reliable Operation of High Density DRAM," IEEE VLSI Cir. Symp. Jun. 2001, pp. 33-34.

Maffitt, T. et al., "Design Considerations for MRAM," IBM J. Res. & Dev., vol. 50, No. 1, Jan. 2006, pp. 25-39.

Meng, X.Z. et al., "Reliability Concept for Electrical Fuses," IEE Proc.-Sci Meas. Technol., vol. 144, No. 2, Mar. 1997, pp. 87-92.

Min, Byung-Jun et al., "An Embedded Non-volatile Fram with Electrical Fuse Repair Scheme and One Time Programming Scheme for High Performance Smart Cards," IEEE CICC, Nov. 2005, pp. 255-258.

Mojumder, N. N. et al., "Three-Terminal Dual-Pillar STT-MRAM for High Performance Robust Memory Applications," IEEE Trans. Elec. Dev. vol. 58. No. 5, May, 2011, pp. 1508-1516. .

Morimoto, T. et al., "A NiSi Salicide Technology for Advanced Logic Devices," IEEE IEDM, Dec. 1991, pp. 653-656.

Neale, Ron, "PCM Progress Report No. 6 Afterthoughts," http://www.eetimes.com/General/PrintView/4236240, Feb. 13, 2012, 5 pages.

Nebashi, R. et al., "A 90nm 12ns 32Mb 2T1MTJ MRAM," IEEE ISSCC Dig. of Tech. Paper, Sess. 27.4, Feb. 2009, 3 pages.

Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.

Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.

Oh, G. H. et al., "Parallel Multi-Confined (PMC) Cell Technology for High Density MLC PRAM," IEEE VLSI Tech. Symp., Jun. 2009, pp. 220-221.

Oh, J. H. et al., "Full Integration of Highly Manufacturable 512Mb PRAM Based on 90nm Technology," IEEE Iedm Dig. of Tech. Paper, Dec. 2006, pp. 1-4.

Osada, K. et al., "Phase Change Ram Operated with 1.5V CMOS as Low Cost Embedded Memory," IEEE CICC, Nov. 2005, pp. 431-434.

Park, Don et al., "Study on Reliability of Metal Fuse for Sub-100nm Technology," IEEE Int. Symp. On Semiconductor Manufacturing (ISSM), 2005, pp. 420-421.

(56) References Cited

OTHER PUBLICATIONS

Park, Jongwoo et al., "Phase Transformation of Programmed NiSi Electrical Fuse: Diffusion, Agglomeration, and Thermal Stability," 18th IEEE Int. Symp. On Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.
Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. 1/2 Jan./Mar. 2007, pp. 65-75.
Robson, Norm et al., "Electrically Programmable Fuse (eFuse) from Memory Redundancy to Autonomic Chips," IEEE CICC, 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech. Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285297.
Takaoka, H. et al., A Novel Via-fuse Technology Featuring Highly Stable Blow Operation with Large On-off Ratio for 32nm Node and Beyond, IEDM, 2007, pp. 4346.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of Mram Memory Technology," IEEE Iedm Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.

Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm Soi Cmos", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. Of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 dated Sep. 18, 2012.
Office Action for U.S. Appl. No. 13/471,704 dated Jul. 31, 2012.
Notice of Allowance for U.S. Appl. No. 13/471,704 dated Oct. 18, 2012.
Notice of Allowance for U.S. Appl. No. 13/026,678 dated Sep. 19, 2012.
Office Action for U.S. Appl. No. 13/026,783 dated Sep. 27, 2012.
Office Action for U.S. Appl. No. 13/026,717 dated Oct. 25, 2012.
Office Action for U.S. Appl. No. 13/026,650 dated Nov. 9, 2012.
Office Action for U.S. Appl. No. 13/026,692 dated Nov. 9, 2012.
Office Action for U.S. Appl. No. 13/026,752 dated Nov. 9, 2012.
Office Action for U.S. Appl. No. 13/026,656 dated Nov. 13, 2012.
Office Action for U.S. Appl. No. 13/026,704 dated Nov. 23, 2012.
Office Action for U.S. Appl. No. 13/397,673, dated Dec. 18, 2012.
Office Action for U.S. Appl. 13/026,840, dated Dec. 31, 2012.
Office Action for U.S. Appl. No. 13/026,852, dated Jan. 14, 2013.
Office Action for U.S. Appl. No. 13/026,783, dated Sep. 27, 2012.
Restriction Requirement for U.S. Appl. No. 13/026,835, dated Dec. 12, 2012.
Notice of Allowance for U.S. Appl. No. 13/026,717, dated Feb. 12, 2013.

(56) References Cited

OTHER PUBLICATIONS

Office Action for U.S. Appl. No. 13/471,704, dated Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, dated Feb. 20, 2013.
Notice of Allowance for U.S. Appl. No. 13/026,783, dated Mar. 4, 2013.
Notice of Allowance for U.S. Appl. No. 13/026,692, dated Mar. 15, 2013.
Office Action for U.S. Appl. No. 13/026,704, dated Nov. 23, 2012.
Notice of Allowance for U.S. Appl. No. 13/026,835, dated Mar. 20, 2013.
Notice of Allowance for U.S. Appl. No. 13/026,664, dated Apr. 22, 2013.
Notice of Allowance for U.S. Appl. No. 13/026,656, dated Apr. 22, 2013.
Jagasivamani et al., "Development of a Low-Power SRAM Compiler", IEEE Press, 2001, pp. 498-501.
Liu et al., "A Flexible Embedded Sram Compiler", IEEE Press, 2002, 3 pgs.
Sundrararajan, "Osuspram: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, dated Apr. 18, 2013.
Notice of Allowance for U.S. Appl. No. 13/026,704, dated Apr. 30, 2013.
Notice of Allowance for U.S. Appl. No. 13/026,852, dated May 10, 2013.
Notice of Allowance for U.S. Appl. No. 13/026,717, dated May 15, 2013.
Notice of Allowance for U.S. Appl. No. 13/471,704, dated May 22, 2013.
Notice of Allowance for U.S. Appl. No. 13/026,678, dated May 28, 2013.
Notice of Allowance for U.S. Appl. No. 13/026,650, dated May 30, 2013.
Restriction Requirement for U.S. Appl. No. 13/314,444, dated Jun. 7, 2013.
Restriction Requirement for U.S. Appl. No. 13/214,198, dated Jun. 13, 2013.
Notice of Allowance for U.S. Appl. No. 13/026,840, dated Jun. 13, 2013.
Restriction Requirement for U.S. Appl. No. 13/026,771, dated Jun. 13, 2013.
Notice of Allowance for U.S. Appl. No. 13/026,752, dated Jul. 1, 2013.
Restriction Requirement for U.S. Appl. No. 13/678,543, dated Jul. 8, 2013.
Office Action for U.S. Appl. No. 13/026,725, dated Jul. 19, 2013.
Notice of Allowance for U.S. Appl. No. 13/026,664, dated Jul. 22, 2013.
Notice of Allowance for U.S. Appl. No. 13/026,692, dated Jul. 23, 2013.
Notice of Allowance for U.S. Appl. No. 13/397,673, dated Jul. 30, 2013.
Notice of Allowance for U.S. Appl. No. 13/026,704, dated Aug. 2, 2013.
Notice of Allowance for U.S. Appl. No. 13/026,783, dated Aug. 5, 2013.
Office Action for U.S. Appl. No. 13/214,198, dated Aug. 6, 2013.
Office action for Chinese Patent Application No. 201110279954.7, dated Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, dated Sep. 9, 2013.
Office Action for U.S. Appl. No. 13/314,444, dated Sep. 9, 2013.
Office Action for U.S. Appl. No. 13/026,771, dated Sep. 9, 2013.
Notice of Allowance for U.S. Appl. No. 13/026,852, dated Sep. 18, 2013.
Office Action (Ex Parte) for U.S. Appl. No. 13/678,543, dated Sep. 20, 2013.
Office Action for U.S. Appl. No. 13/835,308, dated Sep. 27, 2013.
Notice of Allowance for U.S. Appl. No. 13/026,717, dated Oct. 1, 2013.
Office Action for U.S. Appl. No. 13/954,831, dated Oct. 1, 2013.
Notice of Allowance for U.S. Appl. No. 13/026,656, dated Oct. 4, 2013.
Office Action for U.S. Appl. No. 13/214,183, dated Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, dated Nov. 15, 2013.
Notice of Allowance for U.S. Appl. No. 13/026,835, dated Nov. 22, 2013.
Notice of Allowance for U.S. Appl. No. 13/026,725, dated Dec. 10, 2013.
Office Action for U.S. Appl. No. 13/026,783, dated Dec. 23, 2013.
Notice of Allowance for U.S. Appl. No. 13/026,771, dated Jan. 15, 2014.
Office Action for Chinese Patent Application No. 201110244362.1, dated Sep. 29, 2013.
Office Action for Chinese Patent Application No. 201110235464.7, dated Oct. 8, 2013.
Office Action for Chinese Patent Application No. 201110244400.3, dated Nov. 5, 2013.
Office Action for Chinese Patent Application No. 201110244342.4, dated Oct. 31, 2013.
Restriction Requirement for U.S. Appl. No. 13/678,541, dated Feb. 28, 2014.
Notice of Allowance for U.S. Appl. No. 13/026,840, dated Mar. 6, 2014.
Notice of Allowance for U.S. Appl. No. 13/026,840, dated Mar. 10, 2014.
Notice of Allowance of U.S. Appl. No. 13/678,543, dated Dec. 13, 2013.
Notice of Allowance for U.S. Appl. No. 13/835,308, dated Mar. 14, 2014.
Notice of Allowance for U.S. Appl. No. 13/026,835, dated Mar. 14, 2014.
Notice of Allowance for U.S. Appl. No. 13/026,725, dated Mar. 31, 2014.
Notice of Allowance for U.S. Appl. No. 13/026,852, dated Mar. 20, 2014.
Notice of Allowance for U.S. Appl. No. 13/026,771, dated Mar. 18, 2014.
Final Office Action for U.S. Appl. No. 13/214,183, dated Apr. 17, 2014.
"Embedded Systems/Mixed C and Assembly Programming", Wikibooks, Aug 6, 2009, pp. 1-7.
Notice of Allowance for U.S. Appl. No. 13/761,097, dated Jul. 15, 2014.
Office Action for U.S. Appl. No. 13/571,797, dated Apr. 24, 2014.
Notice of Allowance for U.S. Appl. No. 13/590,044, dated Apr. 29, 2014.
Notice of Allowance for U.S. Appl. No. 13/954,831, dated May 27, 2014.

(56) References Cited

OTHER PUBLICATIONS

Notice of Allowance of U.S. Appl. No. 13/833,044, dated May 29, 2014.
Notice of Allowance for U.S. Appl. No. 13/761,048, dated Jun. 10, 2014.
Office Action for Taiwanese Patent Application No. 100129642, dated May 19, 2014 (with translation).
Office Action for U.S. Appl. No. 13/072,783, dated Nov. 7, 2013.
Notice of Allowance for U.S. Appl. No. 13/026,840, dated Jun. 24, 2014.
Notice of Allowance for U.S. Appl. No. 13/214,198, dated Jun. 23, 2014.
Notice of Allowance for U.S. Appl. No. 13/590,044, dated Jun. 23, 2014.
Ker et al., "MOS-bounded diodes for on-chip ESD protection in a 0.15- m shallow-trench-isolation salicided CMOS Process" International Symposium on Vlsi Technology, Systems and Applications, 2003, 5 pgs.
Notice of Allowance for U.S. Appl. No. 13/840,965, dated Jun. 25, 2014.
Office Action for U.S. Appl. No. 13/970,562, dated Jun. 27, 2014.
Office Action for U.S. Appl. No. 13/835,308, dated Jun. 27, 2014.
Notice of Allowance for U.S. Appl. No. 13/288,843, dated Jul. 8, 2014.
Restriction Requirement for U.S. Appl. No. 13/678,539, dated Jul. 1, 2014.
Notice of Allowance for U.S. Appl. No. 14/231,413, dated Jul. 18, 2014.
Notice of Allowance for U.S. Appl. No. 13/590,044, dated Jul. 23, 2014.
Restriction Requirement for U.S. Appl. No. 13/833,067, dated Jul. 11, 2014.
Notice of Allowance for U.S. Appl. No. 13/954,831, dated Aug. 4, 2014.
Restriction Requirement for U.S. Appl. No. 13/678,544, dated Aug. 1, 2014.
Notice of Allowance for U.S. Appl. No. 13/761,097, dated Jul. 25, 2014.
Ex parte Quayle for U.S. Appl. No. 13/761,057, dated Aug. 8, 2014.
Final Office Action for U.S. Appl. No. 13/314,444, dated May 14, 2014.
Corrected Notice of Allowability for U.S. Appl. No. 13/288,843, dated Aug. 19, 2014.
Office Action for U.S. Appl. No. 13/590,049, dated Aug. 29, 2014.
Ex Parte Quayle for U.S. Appl. No. 13/590,047, dated Aug. 29, 2014.
Ex Parte Quayle for U.S. Appl. No. 13/590,050, dated Sep. 3, 2014.
Office Action for U.S. Appl. No. 13/678,544, dated Sep. 12, 2014.
Office Action for U.S. Appl. No. 13/678,539, dated Sep. 10, 2014.
Notice of Allowance for U.S. Appl. No. 13/288,843, dated Sep. 18, 2014.
Notice of Allowance for U.S. Appl. No. 13/761,057, dated Sep. 26, 2014.
Notice of Allowance for U.S. Appl. No. 13/833,044, dated Sep. 24, 2014.
Notice of Allowance for U.S. Appl. No. 13/314,444, dated Sep. 24, 2014.
Office Action for U.S. Appl. No. 13/761,045, dated Sep. 30, 2014.
Notice of Allowance for U.S. Appl. No. 13/835,308, dated Oct. 10, 2014.
Notice of Allowance for U.S. Appl. No. 13/571,797, dated Oct. 14, 2014.
Office Action for U.S. Appl. No. 13/833,067, dated Oct. 20, 2014.
Notice of Allowance for U.S. Appl. No. 14/085,228, dated Oct. 23, 2014.
Office Action for U.S. Appl. No. 13/842,824, dated Oct. 29, 2014.
Herner et al., "Vertical p-i-n. Polysilicon Diode with Antifuse for stackable Field-Programmable ROM", IEEE Electron Device Letters, vol., 25, No. 5, pp. 271-273, May 2004.
Notice of Allowance for U.S. Appl. No. 13/590,049, dated Nov. 25, 2014.
Notice of Allowance for U.S. Appl. No. 13/590,047, dated Nov. 24, 2014.
Office Action for U.S. Appl. No. 13/590,044, dated Dec. 9, 2014.
Notice of Allowance for U.S. Appl. No. 13/590,050, dated Dec. 18, 2014.
Office Action for U.S. Appl. No. 14/042,392, dated Dec. 31, 2014.
Office Action for U.S. Appl. No. 14/071,957, dated Dec. 29, 2014.
International Search Report and Written Opinion for International Patent Application No. PCT/US/2014/056676, dated Dec. 19, 2014.
Office Action for U.S. Appl. No. 14/493,083, dated Jan. 8, 2015.
Office Action for Chinese Patent Application No. 2011102443903, dated Dec. 16, 2014 (with translation).
Notice of Allowance for U.S. Appl. No. 13/970,562, dated Jan. 23, 2015.
Notice of Allowance for U.S. Appl. No. 14/493,069, dated Feb. 17, 2015.
Notice of Allowance for U.S. Appl. No. 14/085,228, dated Feb. 18, 2015.
Notice of Allowance for U.S. Appl. No. 13/761,045, dated Feb. 18, 2015.
Notice of Allowance for U.S. Appl. No. 14/231,404, dated Jan. 22, 2015.
Notice of Allowance for U.S. Appl. No. 14/021,990, dated Dec. 9, 2014.
Final Office Action for U.S. Appl. No. 13/678,544, dated Feb. 15, 2015.
Office Action for U.S. Appl. No. 14/101,125, dated Mar. 6, 2015.
Hassan, "Argument for anti-fuse non-volatile memory in 28nm high-k metal gate", Feb. 15, 2011, wwwl.eeetimes.com publication.
Office Action for U.S. Appl. No. 13/026,783, dated on Mar. 5, 2015.
Final Office Action for U.S. Appl. No. 13/678,539, dated Apr. 1, 2015.
Office Action for U.S. Appl. No. 14/636,155, dated Apr. 10, 2015.
Notice of Allowance for U.S. Appl. No. 14/021,990, dated Apr. 14, 2015.
Notice of Allowance for U.S. Appl. No. 13,842,824, dated Apr. 14, 2015.
Notice of Allowance for U.S. Appl. No. 14/071,957, dated Apr. 14, 2014.
Notice of Allowance for U.S. Appl. No. 14/231,404, dated Apr. 17, 2015.
Notice of Allowance for U.S. Appl. No. 13/590,444, dated May 12, 2015.
Notice of Allowance for U.S. Appl. No. 13/072,783, dated May 13, 2015.
Notice of Allowance for U.S. Appl. No. 13/833,067, dated Jun. 5, 2015.
Office Action for U.S. Appl. No. 13/314,444, dated Dec. 10, 2014.
Final Office Action for U.S. Appl. No. 13/026,783, dated Jul. 30, 2015.
Notice of Allowance for U.S. Appl. No. 14/553,874, dated Aug. 10, 2015.
Office Action for U.S. Appl. No. 14/500,743, dated Aug. 17, 2015.
Notice of Allowance for U.S. Appl. No. 14/042,392, dated Aug. 21, 2015.
Office Action for U.S. Appl. No. 14/485,696, dated Aug. 20, 2015.
Notice of Allowance for U.S. Appl. No. 14/493,083, dated Aug. 27, 2015.
Office Action for U.S. Appl. No. 13/678,539, dated Sep. 16, 2015.
Office Action for U.S. Appl. No. 14/507,691, dated Oct. 30, 2015.
Final Office Action for U.S. Appl. No. 14/101,125, dated Nov. 17, 2015.
Notice of Allowance for U.S. Appl. No. 13/072,783, dated Oct. 27, 2015.
Office Action for U.S. Appl. No. 14/792,479, dated Aug. 28, 2015.
Notice of Allowance for U.S. Appl. No. 14/500,743, dated Dec. 2, 2015.
Notice of Allowance for U.S. Appl. No. 14/636,155, dated Dec. 4, 2015.
Notice of Allowance for U.S. Appl. No. 14/071,957, dated Dec. 4, 2015.

(56) References Cited

OTHER PUBLICATIONS

Notice of Allowance for U.S. Appl. No. 13/678,544, dated Feb. 12, 2016.
Office Action for U.S. Appl. No. 14/749,392, dated Feb. 25, 2016.
Office Action for U.S. Appl. No. 14/940,012, dated Feb. 26, 2016.
Notice of Allowance for U.S. Appl. No. 14/485,698, dated Mar. 1, 2016.
Notice of Allowance for U.S. Appl. No. 14/507,691, dated Mar. 15, 2016.
Final Office Action for U.S. Appl. No. 13/314,444, dated Dec. 8, 2011.
Final Office Action for U.S. Appl. No. 13/678,539, dated Apr. 8, 2016.
Notice of Allowance for U.S. Appl. No. 14/545,775, dated Apr. 12, 2016.
Final Office Action for U.S. Appl. No. 14/101,125, dated Apr. 21, 2016.
Notice of Allowance for U.S. Appl. No. 14/500,743, dated Apr. 26, 2016.
Notice of Allowance for U.S. Appl. No. 14/749,392, dated Jun. 27, 2016.
Notice of Allowance for U.S. Appl. No. 14/940,012, dated Jul. 15, 2016.
Office Action for U.S. Appl. No. 14/985,095, dated Jul. 21, 2016.
Notice of Allowance for U.S. Appl. No. 13/314,444, dated Aug. 5, 2016.
Notice of Allowance for U.S. Appl. No. 14/485,696, dated Sep. 21, 2016.
Notice of Allowance for U.S. Appl. No. 15/076,460, dated Dec. 5, 2016.
Final Office Action for U.S. Appl. No. 14/101,125, dated Dec. 14, 2016.
Office Action for U.S. Appl. No. 15/297,922, dated Dec. 23, 2016.
Office Action for U.S. Appl. No. 15/270,287, dated Dec. 23, 2016.
Final Office Action for U.S. Appl. No. 13/678,539, dated Feb. 8, 2017.
Notice of Allowance for U.S. Appl. No. 15/076,460, dated Mar. 15, 2017.
Office Action for U.S. Appl. No. 15/422,266, dated Mar. 17, 2017.
Office Action for U.S. Appl. No. 15/365,584, dated Apr. 21, 2017.
Notice of Allowance for U.S. Appl. No. 14/485,696, dated May 25, 2017.

* cited by examiner

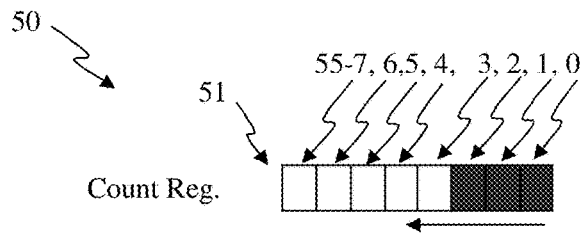
The number of 1's is 3 => Block addressr=3-1=2
FIG. 5
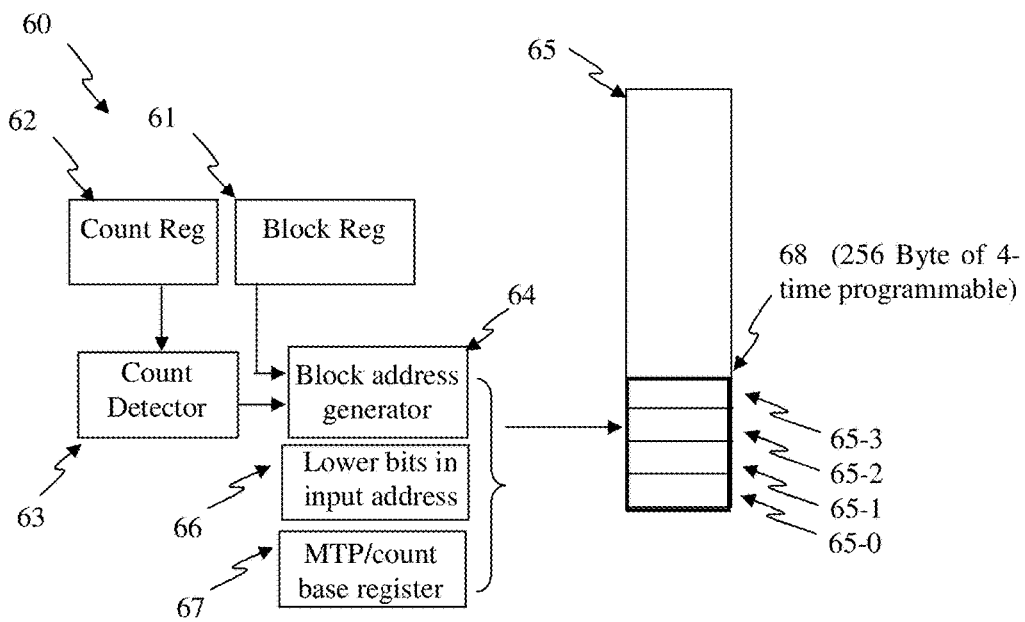
FIG. 6
Count Reg: 0000,0111   Block Reg: 1,0000,0000
Count detector(C): 10   Upper address bits:   10,0000,0000  (C*Block Reg)
Lower addres input +   1001,1101  (BlkAddr+ lowerAddr)
Final address for OTP:   10,1001,1101
FIG. 7

INTEGRATED OTP MEMORY FOR PROVIDING MTP MEMORY

CROSS-REFERENCE TO RELATED APPLICATIONS

This application claims priority benefit of U.S. Provisional Patent Application No. 62/136,608, filed on Mar. 22, 2015, and title "SYSTEM AND METHOD OF AN INTEGRATED OTP FOR MTP MEMORY," which is hereby incorporated herein by reference.

BACKGROUND OF THE INVENTION

OTP, One-Time Programmable, memory is a device that can be programmed once and only once. The OTP can be a fuse that has low resistance state initially to be programmed into a high resistance state. The OTP can be an anti-fuse that has high resistance state initially to be programmed into a lower resistance state. The OTP can also be a charge-trapping device. By determining certain parameters about whether there is sufficient charge stored in a floating gate or oxide/nitride spacer, a proper initial and programmed state can be determined. The fuse can be an interconnect fuse, such as silicided polysilicon, metal, or metal-gate fuse, or a contact/via fuse. The anti-fuse can be a gate-oxide breakdown fuse in a MOS or dielectric breakdown fuse between two conductors.

There are many applications that require a memory can be programmed a few times, from two times to several hundred times, called MTP, Multiple-Time Programmable memory. This kind of device typically falls between one-time OTP and 10K times programmable memory, such as a flash memory. The process requirements for MTP are also different from OTP and flash memory. Normally, in fabrication, MTP can allow adding one or two more masks, while OTP requires zero add-on mask and flash memory can allow adding at least 7-8 masks over the standard logic processes.

An OTP memory can be used to implement an MTP memory. Such as a memory can be referred to as a pseudo-MTP. By using N OTP cells as one pseudo-MTP cell, each pseudo-MTP cell can be programmed N times by programming into the different OTP cells each time in the pseudo-MTP cell. Alternatively, N OTP memories can be used as one N-time programmable MTP by programming into different OTP memory each time.

FIG. 1 shows a block diagram of a portion of a conventional pseudo-MTP system 10 as one exemplary embodiment. The pseudo-MTP system 10 includes a pseudo-MTP memory 18 built into an OTP memory array 15 having 4 blocks of 256 B (Bytes) each block denoted 15-0 through 15-3, respectively. The first time to program an OTP is to program into the block 0, 15-0. The second time is to program into the block 1, 15-1, and so on. A control system 12 is responsible to keep track of program counts by software or hardware and to generate proper addresses to select the suitable blocks in the OTP memory array 15 for access.

The conventional approach to providing a control system to keep track of the number of times programmed and to generate proper addresses is too complicated and thus undesirable for use with a pseudo-MTP. The overhead for the control system is too high to use pseudo-MTP effectively. Thus, there is a need for improved methods and circuits to keep track of program counts and to generate proper addresses to access an OTP memory to emulate an MTP memory. As a result, a pseudo-MTP memory can be rendered very easy to use and its cost can be relatively low.

SUMMARY

Embodiments disclosed herein use various schemes to emulate an MTP memory by using an integrated OTP memory, i.e., a so-called pseudo-MTP memory, with minimum system overhead. The integrated pseudo-MTP memory can have at least one non-volatile register to store program count and block size for different count and block configurations. The integrated pseudo-MTP can use a built-in address mapping scheme to generate proper addresses based on the number of program counts. Thus, the system overhead to access a pseudo-MTP memory can be minimized.

According to one embodiment, a pseudo-memory device can have at least one non-volatile register to store block size and program count information so that a fixed OTP memory can be configured into different tradeoffs between block sizes and program counts. The smaller the block size, the larger the program counts and vice versa. Every time a new round of programming is started, the count register will update at least once so that the follow-on programming will be mapped into a new OTP block associated with the latest program count. Any subsequent read operation will find the latest program count from the program count register and to generate a proper address to access the latest OTP block associated with the latest program count.

The invention can be implemented in numerous ways, including as a method, system, device, or apparatus (including computer readable medium). Several embodiments of the invention are discussed below.

As an OTP-for-MTP memory, one embodiment can, for example, include at least an OTP memory that has a plurality of OTP blocks and at least one non-volatile register to store block size and program count information so that a fixed OTP memory can be configured into different tradeoffs between blocks sizes and program counts. The smaller the block size, the larger the program counts and vice versa. Every time a new round of programming is started the count register can be updated at least once so that follow-on programming can be mapped into a new OTP block associated with the latest program count. Any subsequent read operation will acquire the latest (current) program count from the program count register and generate a proper address to access the latest OTP block associated with the latest program count.

As an electronic system, one embodiment can, for example, include at least: a processor; and an OTP-for-MTP memory operatively connected to the processor. The OTP-for-MTP memory can include at least an OTP memory that has a plurality of OTP blocks and at least one non-volatile register to store block size and program count information so that a fixed OTP memory can be configured into different tradeoffs between blocks sizes and program counts. The smaller the block size, the larger the program counts and vice versa. Every time a new round of programming is started the count register can be updated at least once so that follow-on programming can be mapped into a new OTP block associated with the latest program count. Any subsequent read operation will acquire the latest (current) program count from the program count register and generate a proper address to access the latest OTP block associated with the latest program count.

As a method for building an OTP for MTP memory, one embodiment can, for example, include at least: providing an OTP memory that has a plurality of OTP blocks and at least one non-volatile register to store block size and program count information so that a fixed OTP memory can be configured into various blocks sizes versus different program counts tradeoff. The smaller the block size, the larger the program count can become and vice versa. Every time starting a new round of programming, the count register can be updated at least once so that follow-on programming can be mapped into a new OTP block associated with the updated program count. Any subsequent read will find the latest program count from the program count register and to generate a proper address to access the latest OTP block associated with the latest program count.

BRIEF DESCRIPTION OF THE DRAWINGS

The present invention will be readily understood by the following detailed descriptions in conjunction with the accompanying drawings, wherein like reference numerals designate like structural elements, and in which:

FIG. 5 shows a block diagram of finding the block address from the count register, according to one embodiment.

FIG. 6 shows a portion of block diagram of a pseudo-MTP with an OTP memory array, registers and control logic, according to one embodiment.

FIG. 7 shows a numeric example of generating a final address to access an OTP memory in a pseudo-MTP memory, according to one embodiment.

DETAILED DESCRIPTION OF EMBODIMENTS OF THE INVENTION

Embodiments disclosed herein use various schemes to use a portion of OTP memory with different blocks for different program counts to operate like, i.e., mimic, an MTP memory. Embodiments can also use an automatic address generation to access different blocks in the OTP memory. A portion of OTP memory can be divided into many blocks associated with different program counts. The block sizes can be made smaller to accommodate more program counts, or can be made larger to accommodate fewer program counts. There can be at least one non-volatile register to store block sizes and program counts. There can also be circuitry to generate a block address based on program counts. The block address together with the lower bits in an input address can be used to generate a final address to access the OTP memory accordingly as the latest data that has been programmed. The embodiment can implement in a pseudo-MTP memory.

Several embodiments of the invention are discussed below with reference to FIGS. 2(a)-10. However, those skilled in the art will readily appreciate that the detailed description given herein with respect to these figures is for explanatory purposes as the invention extends beyond these limited embodiments.

Figure 1:
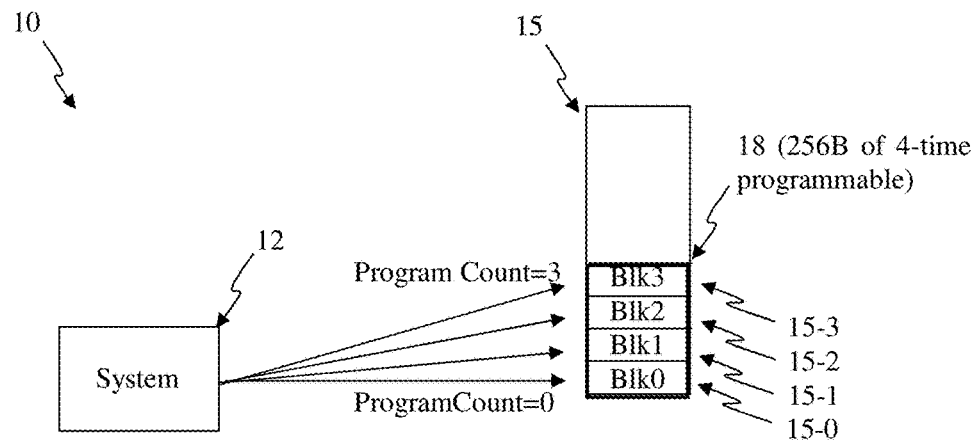
FIG. 1 shows a conventional block diagram of building a pseudo-MTP using a system to keep track of program counts and address mapping.
Figure 2A:
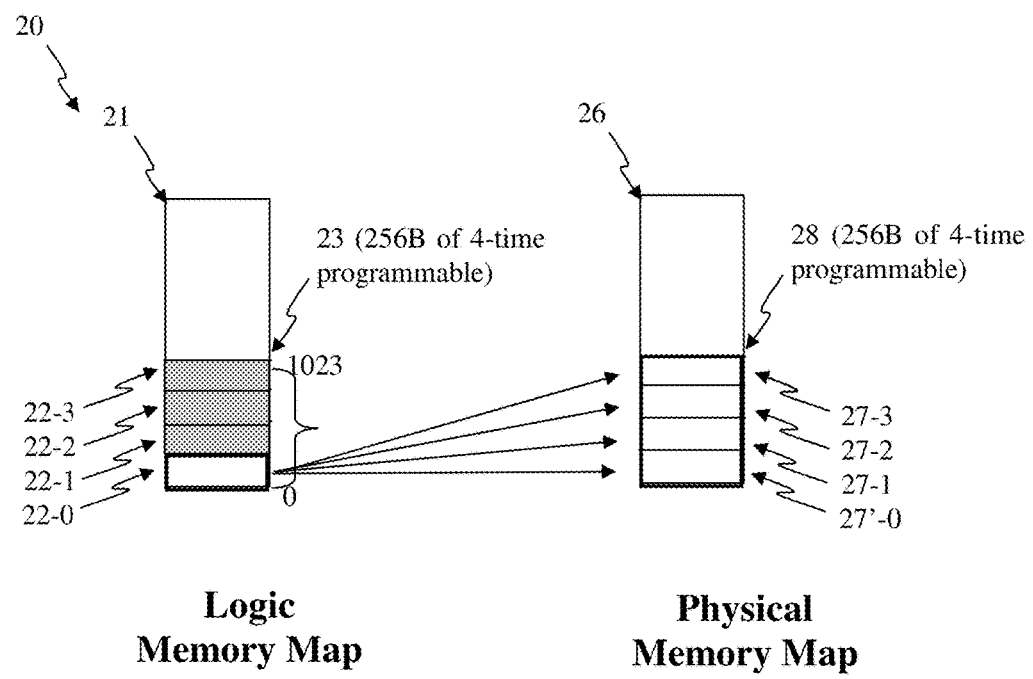
FIG. 2(a) shows a block diagram of logic and physical memory map in a pseudo-MTP memory, according to one embodiment.

FIG. 2(a) shows a block diagram 20 to illustrate the concept of address mapping in an integrated pseudo-MPT macro, i.e., a functional block in an integrated circuit, according to one embodiment. Block diagram 20 has a logic memory map that has a portion of memory 21 having 4 blocks of 256 B memories 22-0 through 22-3. There is also a physical memory map that has an OTP memory 26 having 4 blocks of 256 B OTP memories 27-0 through 27-3 as a pseudo-MTP 28. In the logic memory map, only the block 22-0 is visible when the pseudo-MTP has been used. In other words, any address accesses from 22-0 through 22-3 will be mapped into 22-0 by ignoring the two upper address bits when the pseudo-MTP has been used. On the other hand in the physical memory map, accessing any address in 22-0 in the logic memory map can be mapped into 27-0 through 27-3 automatically, with each macro corresponding to each program count. For example, 22-0 can be mapped into 27-0 for the first program count, 22-0 can be mapped into 27-1 for the second program count, and so on. In another embodiment, only the logic address for block 22-0 can be mapped into the pseudo-MPT memory and the logic addresses for 22-1 through 22-3 can be mapped into other memory locations.

Figure 2B:
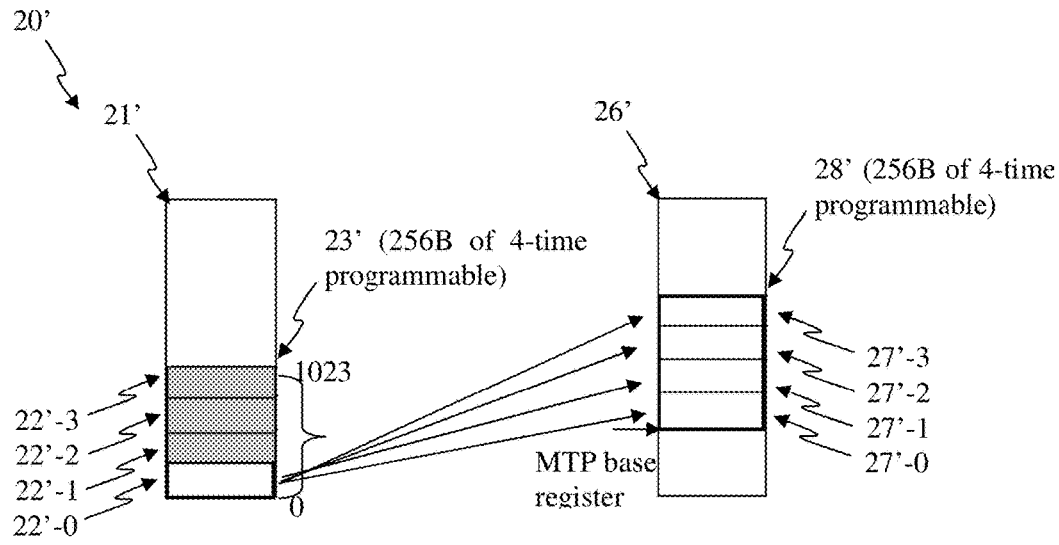
FIG. 2(b) shows a block diagram of logic and physical memory map in a pseudo-MTP memory, according to another embodiment.

FIG. 2(b) shows a block diagram 20' to illustrate the concept of address mapping in an integrated pseudo-MPT macro, according to another embodiment. Block diagram 20' has a logic memory map that has a portion of memory 21' having 4 blocks of 256 B memory 22'-0 through 22'-3. There is also a physical memory map that has an OTP memory 26' having 4 blocks of 256 B OTP memories 27'-0 through 27'-3 as a pseudo-MTP 28'. In the logic memory map, only the block 22'-0 is visible when the pseudo-MTP has been used. In other words, any address accesses from 22'-0 through 22'-3 will be mapped into 22'-0 by ignoring the two upper address bits when the pseudo-MTP has been used. On the other hand in the physical memory map, accessing any address in 22'-0 in the logic memory map can be mapped into 27'-0 through 27'-3 automatically, with each macro corresponding to each program count. For example, 22'-0 will be mapped into 27'-0 for the first program count. 22'-0 will be mapped into 27'-1 for the second program count and so on. The physical address for block 27'-0 through 27'-3 can be mapped with an offset from the logic address in another embodiment. This can be embodied with a non-volatile register, called MTP base register, to relocate the logic address in the physical memory map. There can be a multiple set of MTP base registers to relocate any or all OTP blocks in the physical memory map. In another embodiment, only the logic address for block 22'-0 can be mapped into the pseudo-MPT memory and the logic addresses for 22'-1 through 22'-3 will be mapped into other memory locations.

Figure 2C:
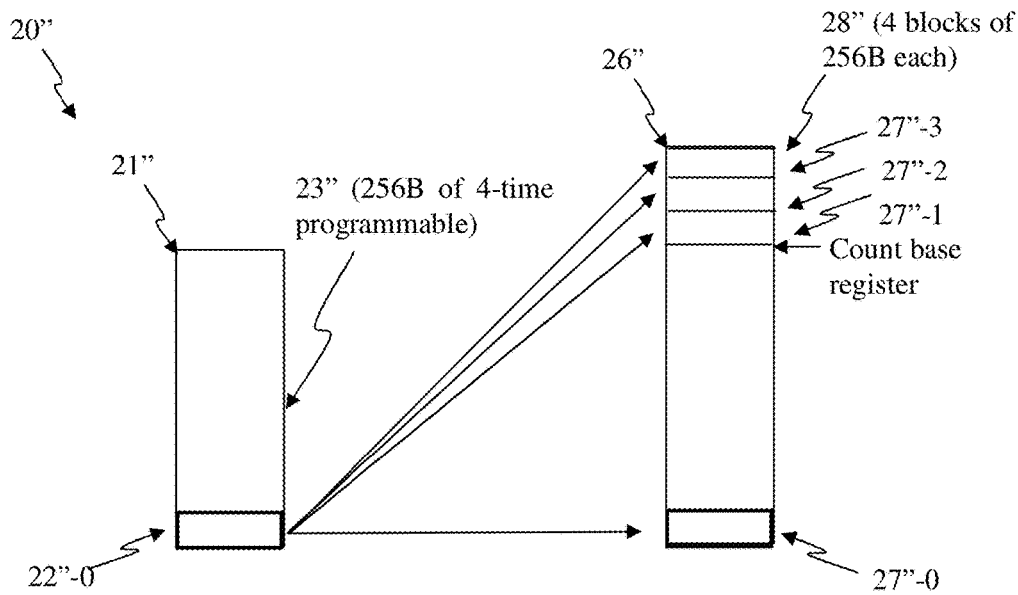
FIG. 2(c) shows a block diagram of logic and physical memory map in a pseudo-MTP memory, according to yet another embodiment.

FIG. 2(*c*) shows a block diagram 20" to illustrate the concept of address mapping in an integrated pseudo-MPT macro, according to another embodiment. Block diagram 20" has a logic memory map that has a portion of memory 21" having one 256 B block of MTP memory 22"-0. There is also a physical memory map that has an OTP memory 26" having 4 blocks of 256 B OTP memories 27"-0 through 27"-3 as a pseudo-MTP memory 28". In the logic memory map, any address accesses in block 22"-0 can be mapped into 27"-0 through 27"-3 automatically, with each macro corresponding to each program count. For example, 22"-0 will be mapped into 27"-0 for the first program count. 22"-0 will be mapped into 27"-1 for the second program count and so on. The physical address for block 27"-1 through 27"-3 can be relocated in the physical memory to make memory management easier. For example, the blocks for program count larger than one, such as block 27"-1 through 27"-3, can be mapped into any physical memory that is reserved, unused, unlikely to be otherwise used, or that is beyond the logic address. This can be embodied using a non-volatile register, called count base register, to relocate the address in the physical memory map for blocks 27"-1 through 27"-3 when the program count is larger than one. There can be multiple sets of count base registers to relocate some or all of OTP blocks associated with different program counts in the physical memory map.

FIGS. 3(*a*) and 3(*b*) illustrates physical memories 30 and 30' of different block size and program count configuration, respectively. In FIG. 3(*a*), a portion of an OTP memory 35 has a 1 KB pseudo-MTP memory 38 that can be configured as 4 blocks of 256 B OTP memory 35-0 through 35-3. Each count of programming will start from blocks 35-0 through 35-3 for up to 4 times. Alternatively, in FIG. 3(*b*) the same OTP memory 35' that has a 1 KB pseudo-MTP memory 38' can be configured as 8 blocks of 128 B OTP memory 35'-0 through 35'-7. Each count of programming will start from 35'-0 through 35'-7 for up to 8 times. There are various schemes that can be used to keep track of different block size and program count configurations in a fixed OTP memory compartment.

FIGS. 4(*a*) and 4(*b*) shows a block diagram 40 and 40', respectively, having at least one block register and one count register in an integrated pseudo-MTP memory according to one embodiment of the present invention. The block registers 41 in FIG. 4(*a*) can have the $8^{th}$ bit 45-8 programmed to indicate a $2^8$ or 256 B block size, corresponding to the configuration in FIG. 3(*a*). Similarly the block register 41' can have the $7^{th}$ bit 45'-7 programmed to indicate a $2^7$ or 128 B block size, corresponding to the configuration in FIG. 3(*b*). The count registers 42 and 42' in FIGS. 4(*a*) and 4(*b*), store the program counts, i.e. count=3 and count=2, corresponding to the latest block addresses 2 and 1 as shown in FIGS. 3(*a*) and 3(*b*), respectively. The block register and count register are non-volatile registers that can be stand-alone OTP registers or OTP cells integrated into an OTP array. The block register should be programmed to set the proper block size before any pseudo-MTP can be used. The entire pseudo-MTP should be read to check if there are any defects before being used. Then when a new program count starts, at least one bit in the count register can be programmed, from the lowest to highest bits, before any actual programming can happen, in one embodiment.

The MTP base register in FIG. 2(*b*), count base register in FIG. 2(*c*), block register and count register in FIGS. 4(*a*) and 4(*b*) can be non-volatile registers so that the configuration can be programmed only once before the pseudo-MTP can be used or each new count of programming. However, there can be some volatile registers to be read as the counterpart of the non-volatile registers upon powering up, chip selected, or triggered by a signal. The volatile registers can be set to any value so that each block in the pseudo-MTP memory can be read arbitrarily. This feature allows checking if all blocks are all 0s before any programming and reading past programmed data for testability considerations.

FIG. 5 shows a block diagram of block address generator 50 based on the count register 51. The count register 51 can be programmed into the $0^{th}$ bit 55-0 before or after the first round of programming and the $1^{st}$ bit 55-1 before or after the second round of programming and so on. The program count can be generated by adding all bits in the count register 51 together (assuming the programmed bits are 1s and un-programmed bits are 0s), or by finding the first 0 in the bit location in the count register 51, starting from the lowest bit. For example, there are three programmed bits so that the total number of 1s is 3 in FIG. 5. Another way to generate program count is to find the first 0 in the bit location starting from the bit position 0, or bit location 3 in FIG. 5. Since the block address starts from 0, the program count 3 corresponds to the block address 3−1=2. If the initial OTP data are 1s and programmed OTP data are 0s, the block address can be generated by adding the complement of all bits in the count register 51 together, or by finding the first 1 in the bit location in the count register in another embodiment. The block address can be used as upper bits in a final address to generate a physical memory address accordingly.

FIG. 6 shows a portion of a pseudo-MTP macro 60 with an OTP memory array 65, a block register 61, count register 62, count detector 63, block address generator 64, lower bits in the input address 66, and MTP/count base register 67, according to one embodiment of the present invention. Every time accessing the pseudo-MTP memory 68 in the OTP memory 65, an address range will be checked first. If the address range is beyond 0 and 1023, accessing the other memory as usual. However, if the input address is between 0 and 1023, an automatic logic to physical memory translation occurs. Firstly, the block register 61 and count register 62 will be checked. Block register 61 should be programmed to indicate a proper block size before use. If the count register 62 is all 0s, this indicates a blank pseudo-MTP 68 before any use. Reading the pseudo-MTP 68 will proceed without any address translation, which means the physical address is identical to the logic address to read blank data (i.e. all 0s) in the 1 KB OTP memory. Before the first count of programming starts, bit location 0 in the count register 62 will be programmed. The count register 62 will be read accordingly. The new count register 62 has only one 1 to indicate the block address is 0 so that all programming will occur in the block 65-0 together with the lower bits in the input address 66 to access any bits in the block 65-0. When reading the pseudo-MTP 68 after the first count of programming finished, the count register 62 will be read as 1 to indicate a block address 0 so that reading bits will be within the block 65-0 and using the lower bits in the input address 66 to read any bits within the block 65-0. In the second count of programming, the bit location 1 in the count register will be programmed and the subsequent programs or read will use the block 65-1 for access. An MTP base register or count base register 67 can be used to relocate some or all of the OTP blocks associated with different program counts in the physical memory.

Figures 3A, 3B:
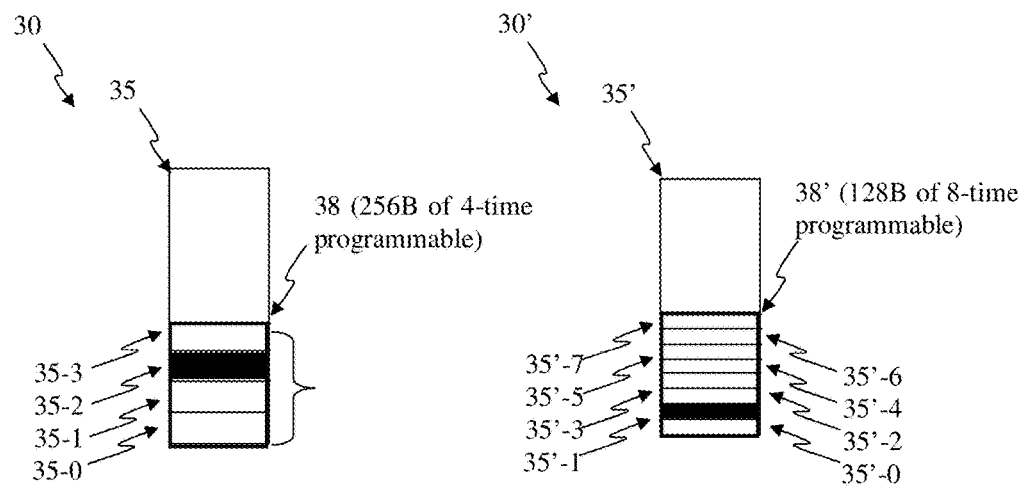
FIG. 3(a) shows a block diagram of a memory map with 1 KB configured as 4 blocks of 256 B 4-time programmable memory, according to one embodiment.
FIG. 3(b) shows a block diagram of a memory map with 1 KB configured as 8 blocks of 128 B 8-time programmable memory, according to another embodiment.
Figures 4A, 4B:
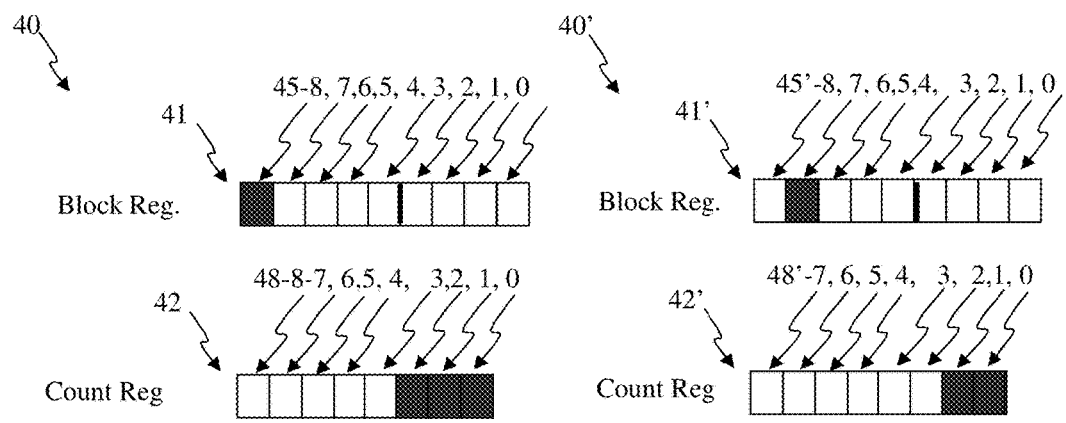
FIG. 4(a) shows a block register and count register associated with 256 B block of 4-time programmable as shown in FIG. 3(a), according to one embodiment.
FIG. 4(b) shows a block register and count register associated with 128 B block of 8-time programmable as shown in FIG. 3(b), according to one embodiment.

FIG. 7 further illustrates the address generation using actual numbers as an example. In FIGS. 3(a) and 4(a), the count register is 0000,0111 to indicate the third count of programming and the block register is 1,0000,0000 to indicate a 256 B block size. The block address is 2 in decimal or 10 in binary, since the count register has three (3) 1s. The address for the block will start at 10,0000,0000, since the block size is 256 B. With the lowest 8-bit address 1001,1101 from the input address, the final address to access the pseudo-MTP memory is 10,1001,1101. In this example, the MTP based register or count based register is not used for simplicity.

FIGS. 3(a) through FIG. 7 are for illustrative purposes as to exemplify the key conceptions of this invention. There are various and equivalent embodiments for this invention and they all fall within the scope of this invention for those skilled in the art. For example, the pseudo-MTP memory can have any memory capacity or block size, though 1 KB and 256 B are used in the above description. The OTP memory can have one portion that is dedicated to OTP and can have a plurality of pseudo-MTP memories with different block/count tradeoffs. The block size can be a byte, two-byte, 256-byte, or any binary numbers, depending on the applications. Similarly, the lowest bit (bit 0) in the block register can indicate a byte, two-byte, 256-byte, or any binary numbers, depending on the application. Programming the count register can be a decoded binary number, such as 001, 010, 011, . . . for the first, second, and third programming counts, respectively, instead of programming a bit in the count register each time starting a new count of programming. Converting the count register into a block address can be achieved by adding all bits or complement of all bits together or by finding the first 0 or 1 in the location of bit stream, and subtracting some offsets if needed. The block register, count register, MTP base register, or count base register can be any stand-alone non-volatile register or can be built into the OTP memory array upon downloaded into volatile registers during powering up, chip selected, or triggered by a signal. The volatile registers can be set to arbitrary values to access any OTP blocks for testability purposes.

Figure 8:
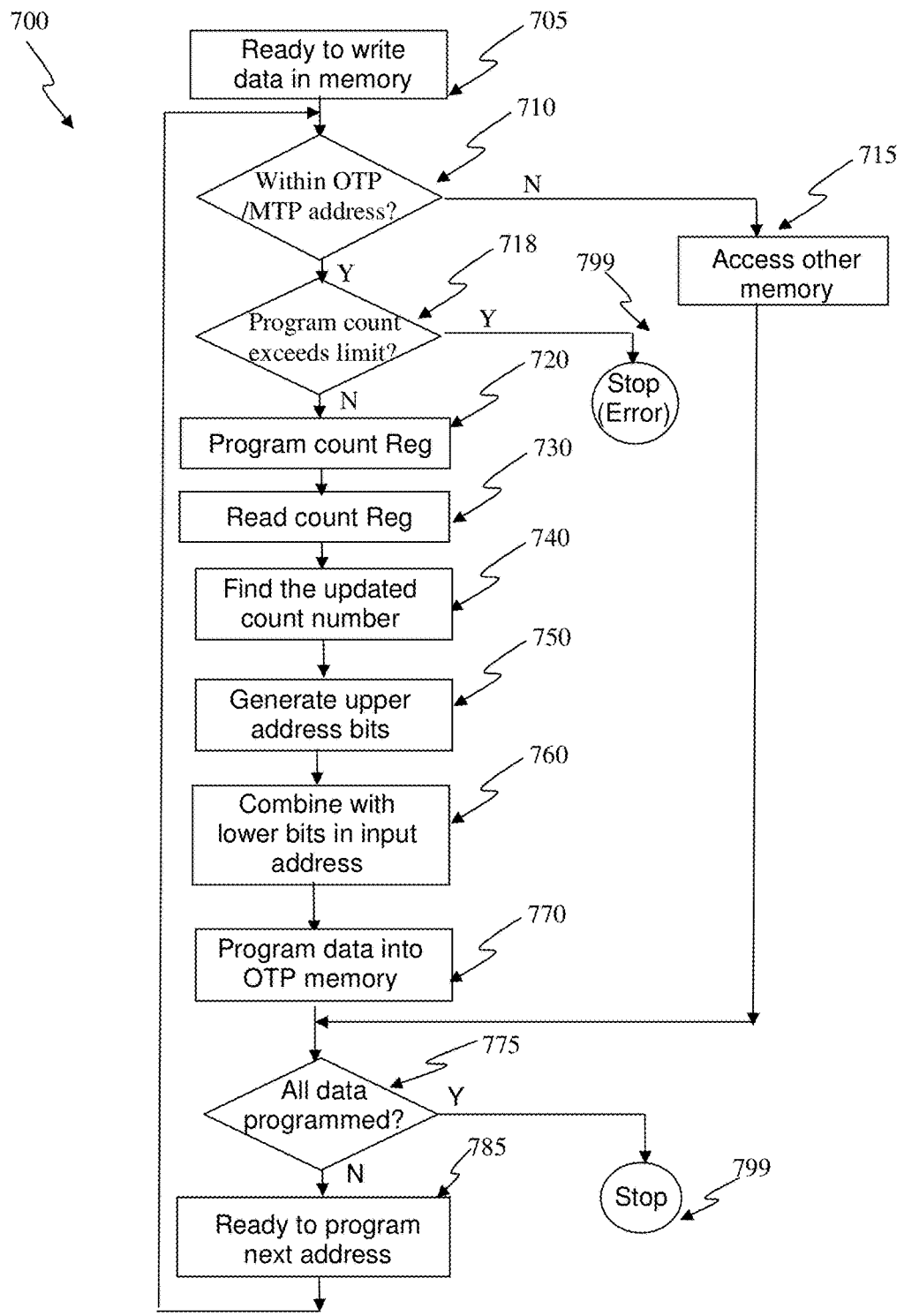
FIG. 8 depicts a method in a flow chart to start a new count of programming in a pseudo-MTP memory, according to one embodiment.

FIG. 8 shows a flow chart 700 depicting a method for programming data in an integrated pseudo-MTP, according to one embodiment. The procedure starts at 705 when an user is ready to write data into a memory when the OTP memory is checked for all blanks and the program supply voltages are properly setup. In step 710, check an input address to determine if the address is within the pseudo-MTP address range. If not, access the other portion of memory in step 715 and go to step 775 to check if more data to be programmed. If yes, check if the program count exceeds a limit in step 718. If yes, the program stops at 799 with an error. If not, program the count register at least once in step 720. Then, read the update count register in step 730 and find the count number in step 740 by adding all bits in the count register. Generate the block address in step 750 by multiplying the block size with the count number and subtracting 1 if needed. Generate a final address for OTP in step 760 by combining the block address with the lower bits in the input address. Adding the final address with an MTP base register or count base register, if needed. Then program the data into the final address generated in step 770. Check if all data have been programmed in the next step 775. If not, ready to program the next address in step 785 and go to step 710, otherwise the programming stops at 799.

Figure 9:
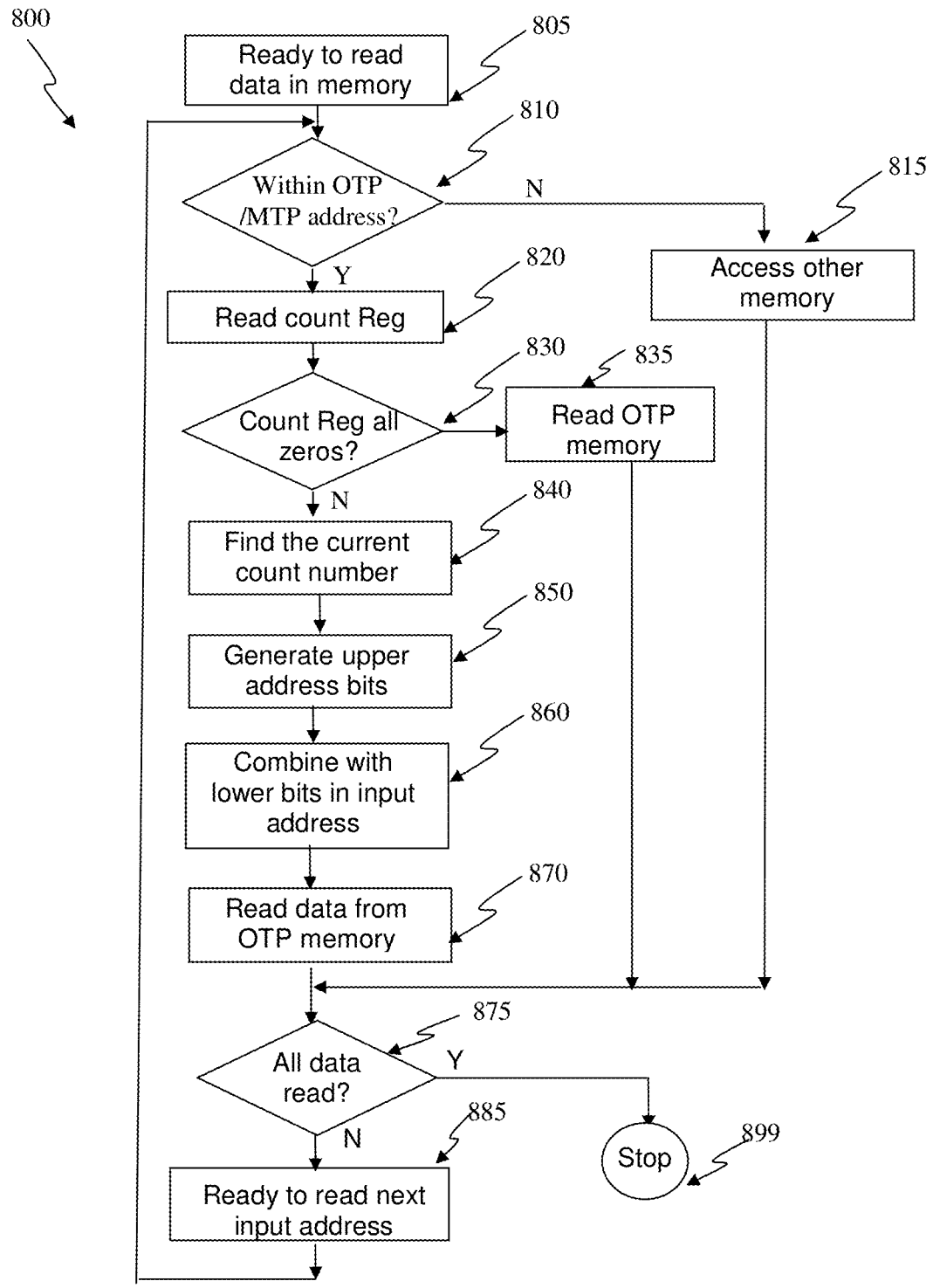
FIG. 9 depicts a method in a flow chart to read pseudo-MTP memory, according to one embodiment.

FIG. 9 shows a flow chart 800 depicting a method for reading data in an integrated pseudo-MTP, according to one embodiment. The procedure starts at 805 when an user is ready to read data from a memory. In step 810, check if an input address is within the pseudo-MTP address range. If not, access the other portion of memory in step 815 and go to step 875 to check if more data to be read. If yes, read the count register in step 820. Then, check if all bits in the count register are all zero in step 830. If yes, read the OTP memory with the input address in step 835 and go to step 875 to check if more data to be read. If not, find the latest count number in the count register in step 840. Then, use the count number to generate the block address in step 850. Generate the final address in step 860 by combining the block address with the lower bits in the input address. Adding the final address with an MTP base register or count base register, if needed. Then, read the pseudo-MTP with the final address generated in step 870 accordingly. Check if all data have been read in step 875. If not, ready to read the next input address in step 885 and go to step 810, otherwise stop reading data in step 899.

FIGS. 8 and 9 illustrate flow charts depicting embodiments of a programming method 700 and a read method 800, respectively, in accordance with certain embodiments. The methods 700 and 800 are described in the context of a memory, such as the memory 60 in FIG. 6. In addition, although described as a flow of steps, one of ordinary skilled in the art will recognize that at least some of the steps may be performed in a different order, including simultaneously, or skipped.

Figure 10:
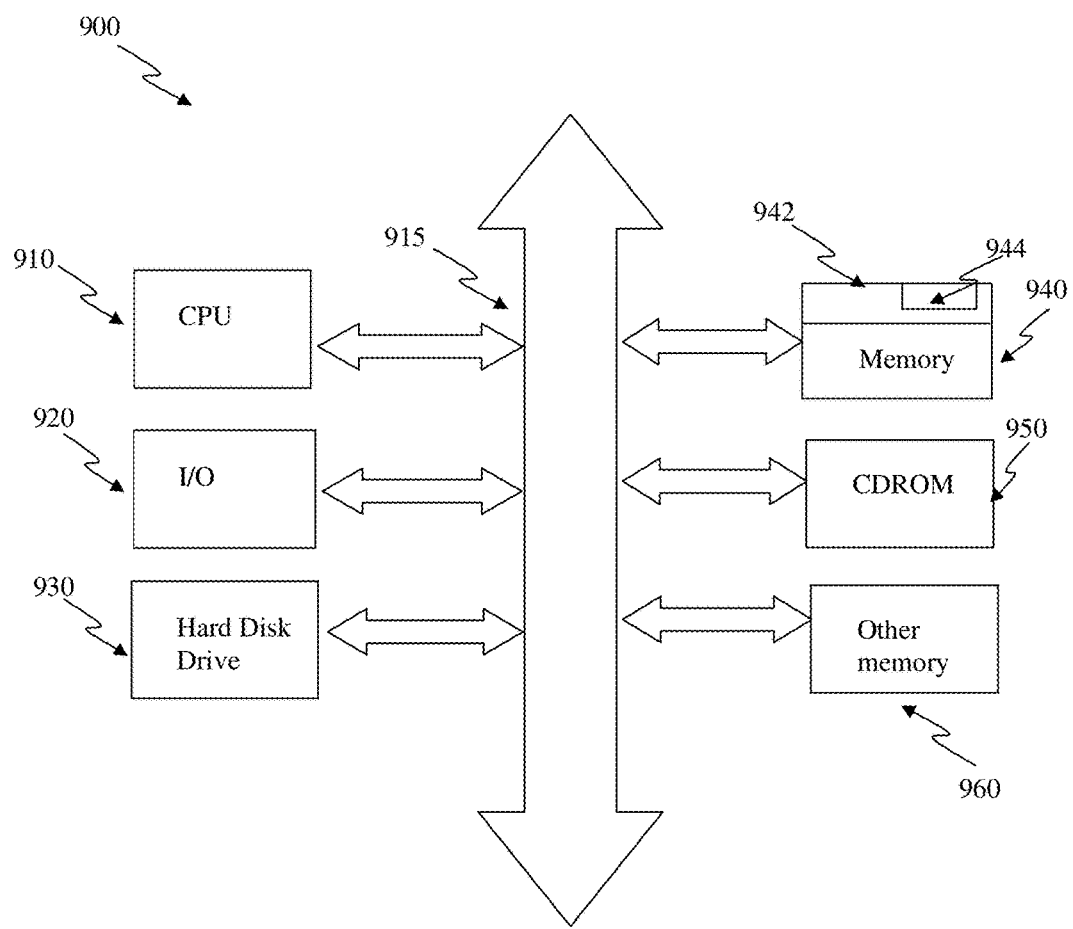
FIG. 10 shows a block diagram of a portion of an electronics system using a pseudo-MTP memory, according to one embodiment.

FIG. 10 shows an electronic system 900 according to one embodiment. The electronic system 900 can include a pseudo-MTP memory 940, such as a plurality of OTP memory cell 944 in at least one OTP memory array 942, according to one embodiment. The electronic system 900 can, for example, pertain to a computer system. The electronic system can include a Central Process Unit (CPU) 910, which communicate through a common bus 915 to various memory and peripheral devices such as I/O 920, hard disk drive 930, CDROM 950, and other memory 960. Other memory 960 is a conventional memory such as DRAM, SRAM, ROM, or flash that can interface to CPU 910 through a memory controller. CPU 910 generally is a microprocessor, a digital signal processor, or other programmable digital logic devices. Memory 940 can be constructed as an integrated circuit, which includes the at least memory array 942 and at least one OTP memory 944 for building a pseudo-MTP memory 940. The pseudo-MTP memory 940 can interface to CPU 910 through a memory controller. If desired, the memory 940 may be combined with the processor, for example CPU 910, in a single integrated circuit.

The embodiments of invention can be implemented in a part or all of an OTP, One-Time-Programmable memory, to emulate functionality of an MTP memory. The OTP can be an electrical fuse, anti-fuse, or charge-trapping device, depending on different embodiments. The electrical fuse can be an interconnect fuse, such as silicided polysilicon, metal, or metal-gate fuse, or can be a contact/via fuse. The anti-fuse can be a MOS gate oxide breakdown anti-fuse or can be a dielectric breakdown anti-fuse built between two conductors. The charge-trapping OTP can be based on charge-trapping mechanism in the floating gate or oxide/nitride spacer. There are many variations and equivalent embodiments of building OTPs for MTP and they all fall within the scope of this invention for those skilled in the art.

Additional details on OTP devices, including designing, using and programming thereof, can be found in: (i) U.S. patent application Ser. No. 13/471,704, filed on May 15, 2012 and entitled "Circuit and System of Using Junction Diode as Program Selector for One-Time Programmable Devices," which is hereby incorporated herein by reference; (ii) U.S. patent application Ser. No. 13/026,752, filed on Feb. 14, 2011 and entitled "Circuit and System of Using Junction Diode as Program Selector for One-Time Programmable Devices," which is hereby incorporated herein by reference; (iii) U.S. patent application Ser. No. 13/026,656, filed on Feb. 14, 2011 and entitled "Circuit and System of Using Polysilicon Diode As Program Selector for One-Time Programmable Devices," which is hereby incorporated herein by reference; (iv) U.S. patent application Ser. No. 13/026,752, filed on Feb. 14, 2011 and entitled "Circuit and System of Using a Junction Diode as Program Selector for One-Time Programmable Devices," which is hereby incorporated herein by reference; (v) U.S. patent application Ser. No. 13/954,831, filed on Jul. 30, 2013 and entitled "Circuit and System of Using Junction Diode as Program Selector for One-Time Programmable Devices," which is hereby incorporated herein by reference; (vi) U.S. patent application Ser. No. 13/471,704, filed on May 15, 2012 and entitled "Circuit and System of Using a Junction Diode as Program Selector for One-Time Programmable Devices," which is hereby incorporated herein by reference; (vii) U.S. patent application Ser. No. 13/835,308, filed on Mar. 5, 2013 and entitled "Circuit and System of Using a Junction Diode as Program Selector for One-Time Programmable Devices," which is hereby incorporated herein by reference; (viii) U.S. patent application Ser. No. 13/840,965, filed on Mar. 15, 2013 and entitled "Circuit and System of Using Junction Diode as Program Selector and Mos as Read Selector for One-Time Programmable Devices," which is hereby incorporated herein by reference; (ix) U.S. patent application Ser. No. 13/970,562, filed on Aug. 19, 2013 and entitled "Circuit and System of Using Junction Diode as Program Selector for Metal Fuses for One-Time Programmable Devices," which is hereby incorporated herein by reference; (x) U.S. patent application Ser. No. 13/842,824, filed on Mar. 15, 2013 and entitled "Circuit and System of Using a Junction Diode as Program Selector for One-Time Programmable Devices," which is hereby incorporated herein by reference; (xi) U.S. patent application Ser. No. 14/749,392, filed on Jun. 24, 2015 and entitled "Circuit and System of Using a Junction Diode as Program Selector for One-Time Programmable Devices," which is hereby incorporated herein by reference; (xii) U.S. patent application Ser. No. 14/485,698, filed on Sep. 13, 2014 and entitled "One-Time Programmable Devices Using Junction Diode as Program Selector for Electrical Fuses with Extended Area," which is hereby incorporated herein by reference; (xiii) U.S. patent application Ser. No. No. 14/485,696, filed on Sep. 13, 2014 and entitled "Method and Structure for Reliable Electrical Fuse Programming," which is hereby incorporated herein by reference; (xiv) U.S. patent application Ser. No. 14/644,020, filed on Mar. 10, 2015 and entitled "Method and Structure for Reliable Electrical Fuse Programming," which is hereby incorporated herein by reference; (xv) U.S. patent application Ser. No. 13/590,044, filed on Aug. 20, 2012 and entitled "Multiple-Bit Programmable Resistive Memory Using Diode as Program Selector," which is hereby incorporated herein by reference; (xvi) U.S. patent application Ser. No. 13/288,843, filed on Nov. 3, 2011 and entitled "Low-In-Count Non-Volatile Memory Interface," which is hereby incorporated herein by reference; (xvii) U.S. patent application Ser. No. 14/553,874, filed on Nov. 25, 2014 and entitled "Low-In-Count Non-Volatile Memory Interface," which is hereby incorporated herein by reference; (xviii) U.S. patent application Ser. No. 14/231,404, filed on Mar. 31, 2014 and entitled "Low-Pin-Count Non-Volatile Memory Interface with Soft Programming Capability," which is hereby incorporated herein by reference; (xix) U.S. patent application Ser. No. 14/792,479, filed on Jul. 6, 2015 and entitled "Low-Pin-Count Non-Volatile Memory Interface with Soft Programming Capability," which is hereby incorporated herein by reference; (xx) U.S. patent application Ser. No. 14/231,413, filed on Mar. 31, 2014 and entitled "Low-In-Count Non-Volatile Memory Embedded in a Integrated Circuit without any Additional Pins for Access," which is hereby incorporated herein by reference; (xxi) U.S. patent application Ser. No. 14/493,069, filed on Sep. 22, 2014 and entitled "Low-In-Count Non-Volatile Memory Interface for 3D IC," which is hereby incorporated herein by reference; (xxii) U.S. patent application Ser. No. 14/636,155, filed on Mar. 2, 2015 and entitled "Low-In-Count Non-Volatile Memory Interface for 3D IC," which is hereby incorporated herein by reference; (xxiii) U.S. patent application Ser. No. 13/761,057, filed on Feb. 6, 2013 and entitled "Circuit and System for Testing a One-Time Programmable (OTP) Memory," which is hereby incorporated herein by reference; and (xxiv) U.S. patent application Ser. No. 14/500,743, filed on Sep. 29, 2014 and entitled "Circuit and System of Using Finfet for Building Programmable Resistive Devices," which is hereby incorporated herein by reference.

The above description and drawings are only to be considered illustrative of exemplary embodiments, which achieve the features and advantages of certain embodiments of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A pseudo-MTP memory that uses at least a portion of One-Time Programmable (OTP) memory to function as a Multiple-Time Programmable (MTP) memory, comprising:
   at least one OTP memory array having a plurality of OTP blocks;
   at least one block register configured to provide non-volatile storage for a block size; and
   at least one count register configured to store a program count;
   wherein the count register is programmed at least once each time starting a new programming a different one the of the OTP blocks in the OTP memory array, and
   wherein a final address to access the different blocks of the OTP memory array is generated based on the at least one count register, the at least one block register, and an input address.

2. A pseudo-MTP memory as recited in claim 1, wherein the block register is programmed to configure the block size before at least one block of the OTP memory array is programmed.

3. A pseudo-MTP memory as recited in claim 1, wherein the final address to access the OTP memory array is generated by using the at least one count register to determine a block address and by using the lower bits in the input address to determine a memory location within one of the blocks.

4. A pseudo-MTP memory as recited in claim 1, wherein the final address to access the OTP blocks is relocated in a memory map by adding an offset set from at least one register.

5. A pseudo-MTP memory as recited in claim 1, wherein the final address to access the OTP blocks associated with the program count higher than one is relocated in a memory map by adding an offset from at least one register.

6. A pseudo-MTP memory as recited in claim 1, wherein at least one bit in the at least one count register is programmed consecutively starting from the lowest or the highest bit location, when starting a new count of programming each time.

7. A pseudo-MTP memory as recited in claim 1, wherein a block address is generated from the at least one count register by adding all bits or complement of all bits in the at least one count register with an offset subtracted, if needed.

8. A pseudo-MTP memory as recited in claim 1, wherein a block address is generated from the at least one count register by finding the first 1 or 0 bit location, starting from the lowest or highest bit location with an offset subtracted, if needed.

9. A pseudo-MTP memory as recited in claim 1, wherein the at least one block register and/or the at least one count register is in the OTP memory array and is read into one or more volatile registers upon powering up, chip selected, or triggered by a signal.

10. A pseudo-MTP memory as recited in claim 1, wherein the at least one block register or the at least one count register has at least one counterpart of volatile register that can be set to any arbitrary values to access any of the OTP blocks associated with different program counts.

11. A pseudo-MTP memory as recited in claim 1, wherein at least one OTP cell in the OTP memory array includes at least one of electrical fuse, anti-fuse, charge-trapping device, or combination thereof.

12. An electronic system, comprising:
a processor; and
a pseudo-MTP memory operatively connected to the processor, the pseudo-MTP memory comprising:
at least one OTP array having a plurality of OTP blocks; and
at least one non-volatile register to store a block size and a program count,
wherein the register is programmed at least once to store the program count each time when starting a new count of programming the OTP array; and
wherein a final address will be generated based on the count stored in the register, the block size stored in the register, and an input address to access the different blocks of the OTP memory.

13. An electronic system as recited in claim 12, wherein the register in the pseudo-MTP memory is programmed to configure the block size before the pseudo-MTP is used.

14. An electronic system as recited in claim 12, wherein the final address used by the pseudo-MTP memory to access the OTP memory is generated by using the program count to determine a block address and by using with the lower bits in the input address to determine a memory location within a block.

15. An electronic system as recited in claim 12, wherein at least one bit in the register in the pseudo-MTP memory is programmed consecutively starting from the lowest or the highest bit location, each time a new count of programming is started.

16. A method for providing an integrated One-Time Programmable (OTP) memory to function as a Multiple-Time Programmable (MTP) memory, the method comprising:
providing at least one OTP memory array having a plurality of OTP memory blocks;
providing at least one non-volatile block register and at least one non-volatile count register, the at least one non-volatile block register storing a block size and the at least one non-volatile count register storing a program count;
programming at least one non-volatile count register at least once before starting a new count of programming of the OTP memory;
reading the program content and the block size respectively from the at least one non-volatile count register and the at least one non-volatile block register before any subsequent programming or reading the pseudo-MTP memory;
wherein a final address for use in accessing the OTP memory is generated based on the program count, the block size, and an input address to access the blocks in the OTP memory.

17. A method as recited in claim 16, wherein the block register is programmed to configure the block size before the pseudo-MTP is placed in use.

18. A method as recited in claim 16, wherein the final address to access the OTP memory is generated by using the program count stored in the at least one non-volatile count register to determine a block address and using the lower bits in the input address to determine a memory location within a block.

19. A method as recited in claim 16, wherein the final address to access at least one of the OTP memory blocks associated with one program count is relocated in the memory map by adding an offset from the at least one non-volatile block register.

20. A method as recited in claim 16, wherein at least one bit in the at least one non-volatile count register is programmed consecutively starting from the lowest or the highest bit location each time a new count of programming is performed.

21. A method as recited in claim 16, wherein a block address is generated from the at least one non-volatile count register by adding all bits or the complement of all bits in the at least one non-volatile count register with an offset subtracted.

22. A method as recited in claim 16, wherein a block address is generated from the at least one non-volatile count register by finding the first 1 or 0 bit location, starting from the lowest or highest bit location with an offset subtracted.

23. A method as recited in claim 16, wherein the at least one non-volatile block register and/or the at least one non-volatile count register is provided in the OTP memory array and is read into one or more volatile registers upon powering up or chip selected.

* * * * *